US012620545B2

(12) United States Patent
Yoshino

(10) Patent No.: US 12,620,545 B2
(45) Date of Patent: May 5, 2026

(54) BLANKING APERTURE ARRAY SYSTEM AND MULTI CHARGED PARTICLE BEAM WRITING APPARATUS

(71) Applicant: NuFlare Technology, Inc., Yokohama (JP)

(72) Inventor: Shuji Yoshino, Kunitachi (JP)

(73) Assignee: NuFlare Technology, Inc., Yokohama (JP)

( * ) Notice: Subject to any disclaimer, the term of this patent is extended or adjusted under 35 U.S.C. 154(b) by 421 days.

(21) Appl. No.: 18/482,972

(22) Filed: Oct. 9, 2023

(65) Prior Publication Data

US 2024/0186100 A1 Jun. 6, 2024

(30) Foreign Application Priority Data

Dec. 1, 2022 (JP) ................................. 2022-192962

(51) Int. Cl.
　　*H01J 37/04* (2006.01)
　　*G03F 7/20* (2006.01)

(52) U.S. Cl.
　　CPC .......... *H01J 37/045* (2013.01); *G03F 7/2045* (2013.01); *G03F 7/2059* (2013.01); (Continued)

(58) Field of Classification Search
　　CPC ............... H01J 37/045; H01J 2237/026; H01J 2237/31774; G03F 7/2045; G03F 7/2059
　　See application file for complete search history.

(56) References Cited

U.S. PATENT DOCUMENTS

| | | | |
|---|---|---|---|
| 6,014,200 A | 1/2000 | Sogard et al. | |
| 9,287,081 B2 | 3/2016 | Van Melle et al. | |

(Continued)

FOREIGN PATENT DOCUMENTS

| | | | |
|---|---|---|---|
| JP | 11-317357 A | 11/1999 | |
| JP | 2012-004415 A | 1/2012 | |

(Continued)

OTHER PUBLICATIONS

US 11,177,107 B2, 11/2021, Kishi et al. (withdrawn)

(Continued)

*Primary Examiner* — Sean M Luck
(74) *Attorney, Agent, or Firm* — Oblon, McClelland, Maier & Neustadt, L.L.P.

(57) ABSTRACT

In one embodiment, a blanking aperture array system includes a blanking aperture array substrate provided blankers corresponding to each beam of a multi beam, a first radiation shield, and a second radiation shield. A circuit section applying a voltage to the blankers is disposed closer to a peripheral edge than a cell section including the blankers. The first radiation shield includes a first plate covering over the circuit section, disposed on an upper surface of the blanking aperture array substrate, and extending from a peripheral edge of a first opening for passage of the multi beam. The second radiation shield covers under the circuit section, and includes a lower peripheral wall section that hangs down from a lower surface of the blanking aperture array substrate and surrounds the cell section, and a lower plate extending from a peripheral edge of a lower opening for passage of the multi beam.

14 Claims, 8 Drawing Sheets

(52) U.S. Cl.
 CPC .................... *H01J 2237/026* (2013.01); *H01J 2237/31774* (2013.01)

(56) References Cited

U.S. PATENT DOCUMENTS

| | | | |
|---|---|---|---|
| 9,880,215 | B2 | 1/2018 | Yamashita |
| 10,211,023 | B2 | 2/2019 | Matsumoto et al. |
| 10,256,070 | B2 | 4/2019 | Matsumoto et al. |
| 11,205,557 | B2 | 12/2021 | Kishi et al. |
| 2018/0182593 | A1* | 6/2018 | Matsumoto ............. H01J 37/09 |
| 2019/0051494 | A1 | 2/2019 | Yamashita |
| 2022/0338186 | A1 | 10/2022 | Cook et al. |
| 2022/0392731 | A1 | 12/2022 | Yoshino |

FOREIGN PATENT DOCUMENTS

| | | |
|---|---|---|
| JP | 2012-182294 A | 9/2012 |
| JP | 2014-513432 A | 5/2014 |
| JP | 2016-54292 A | 4/2016 |
| JP | 2016-076548 A | 5/2016 |
| JP | 2017-079259 A | 4/2017 |
| JP | 2017-199610 A | 11/2017 |
| JP | 2017-216338 A | 12/2017 |
| JP | 2019-33285 A | 2/2019 |
| JP | 2020-178055 A | 10/2020 |
| JP | 2022-185486 A | 12/2022 |
| KR | 10-2020-0122993 A | 10/2020 |
| TW | 1706430 B | 10/2020 |
| TW | 1715856 B | 1/2021 |

OTHER PUBLICATIONS

Combined Taiwanese Office Action and Search Report issued Mar. 10, 2025 in Taiwanese Patent Application No. 112138673, 4 pages.
English Machine translation of Korean Notice of Allowance issued Oct. 27, 2025 in Korean Patent Application Nol. 10-2023-0151633, 3 pgs.
Japanese Office Action dated Jan. 9, 2026, issued in Japanese Patent Application No. 2022-192962 (with English translation).

\* cited by examiner

BLANKING APERTURE ARRAY SYSTEM AND MULTI CHARGED PARTICLE BEAM WRITING APPARATUS

CROSS REFERENCE TO RELATED APPLICATION

This application is based upon and claims benefit of priority from the Japanese Patent Application No. 2022-192962, filed on Dec. 1, 2022, the entire contents of which are incorporated herein by reference.

FIELD

The present invention relates to a blanking aperture array system and a multi charged particle beam writing apparatus.

BACKGROUND

With high integration of semiconductor integrated circuits (LSI), the design dimensions of semiconductor device (MOSFET: metal-oxide semiconductor field-effect transistor) are still being miniaturized according to Moore's Law. Lithography to achieve the miniaturization is an extremely important technique to generate a pattern in a semiconductor manufacturing process. In order to form a desired LSI circuit pattern on a wafer, as a mainstream technique, a highly accurate original pattern (a mask, or also called reticle when particularly used in a stepper or a scanner) formed on a quartz is reduced and transferred onto a resist (photosensitive resin) coated on the wafer using a reduction projection exposure apparatus. Nowadays, in leading edge fine pattern formation, EUV scanners using extreme ultraviolet (EUV) rays as a light source are also being adopted. In EUV exposure, an EUV mask is used, which is obtained by patterning, on a quartz, a multi-layer film for reflecting EUV, and an absorber further formed over the multi-layer film. Either mask is manufactured using an electron beam writing apparatus that essentially applies an electron beam with a high resolution.

A writing apparatus that uses a multi-beam can emit many beams at one time, as compared to when writing is performed with a single electron beam, thus the throughput can be significantly improved. In a multi-beam writing apparatus using a blanking aperture array substrate, as an embodiment of the multi-beam writing apparatus, an electron beam emitted from an electron source passes through a shaping aperture array substrate having a plurality of openings to form a multi-beam (a plurality of electron beams). The multi-beam passes through corresponding blankers of the blanking aperture array substrate. The blanking aperture array substrate has electrode pairs (blankers) each for independently deflecting a beam, and an opening for beam passage between each electrode pair, and blanking deflection is independently performed on a passing electron beam by fixing one of an electrode pair to the ground potential and switching the other electrode between the ground potential and another potential. An electron beam deflected by a blanker is blocked by the limiting aperture, and an electron beam not deflected by a blanker is emitted onto a sample. The blanking aperture array substrate is equipped with a circuit to independently control the electrode potential of each blanker.

When an electron beam is emitted to a shaping aperture array substrate provided with openings to form a multi-beam, bremsstrahlung X-rays are generated. In addition, when a multi-beam is formed by a shaping aperture array substrate, part of the electron beams is scattered at the edges of openings, producing scattered electrons. When the bremsstrahlung X-rays and/or the scattered electrons are emitted to the blanking aperture array substrate, the electrical characteristics of MOSFETs included in a circuit device may deteriorate due to total ionizing dose (TID) effect, and improper functioning of the circuit device may be caused.

BRIEF DESCRIPTION OF THE DRAWINGS

FIG. 1 is a schematic view of a multi charged particle beam writing apparatus according to an embodiment of the present invention.

FIG. 11 is a schematic configuration view of a blanking aperture array system according to a modification.

DETAILED DESCRIPTION

Figure 2:
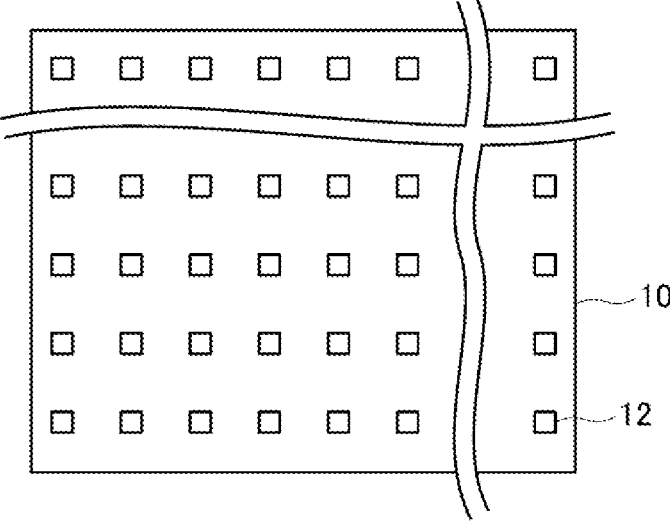
FIG. 2 is a plan view of a shaping aperture array substrate.

In one embodiment, a blanking aperture array system includes a blanking aperture array substrate including a plurality of beam passage holes, through which beams in a multi charged particle beam pass from upstream to downstream, the plurality of beam passage holes being provided with respective blankers that perform blanking deflection on the beams, a first radiation shield disposed upstream of the blanking aperture array substrate, and a second radiation shield disposed downstream of the blanking aperture array substrate. A cell section including the beam passage holes and the blankers is provided in a central part of the blanking aperture array substrate, and a circuit section including a circuit element that applies a voltage to each of the blankers is disposed closer to a peripheral edge of the blanking aperture array substrate than the cell section. The first radiation shield includes a first plate covering over the circuit section, disposed on an upper surface of the blanking aperture array substrate, provided with a first opening for passage of the multi charged particle beam, and extending from a peripheral edge of the first opening. The second radiation shield covers under the circuit section, and is provided with a lower opening for passage of the multi charged particle beam, the second radiation shield including a lower peripheral wall section that hangs down from a lower surface of the blanking aperture array substrate and surrounds the cell section, and a lower plate extending from a peripheral edge of the lower opening.

Hereinafter, an embodiment of the present invention will be described based on the drawings. In the embodiment, the configuration using an electron beam as an example of a charged particle beam will be described. However, the charged particle beam is not limited to an electron beam, and may be an ion beam or the like.

Figure 1:
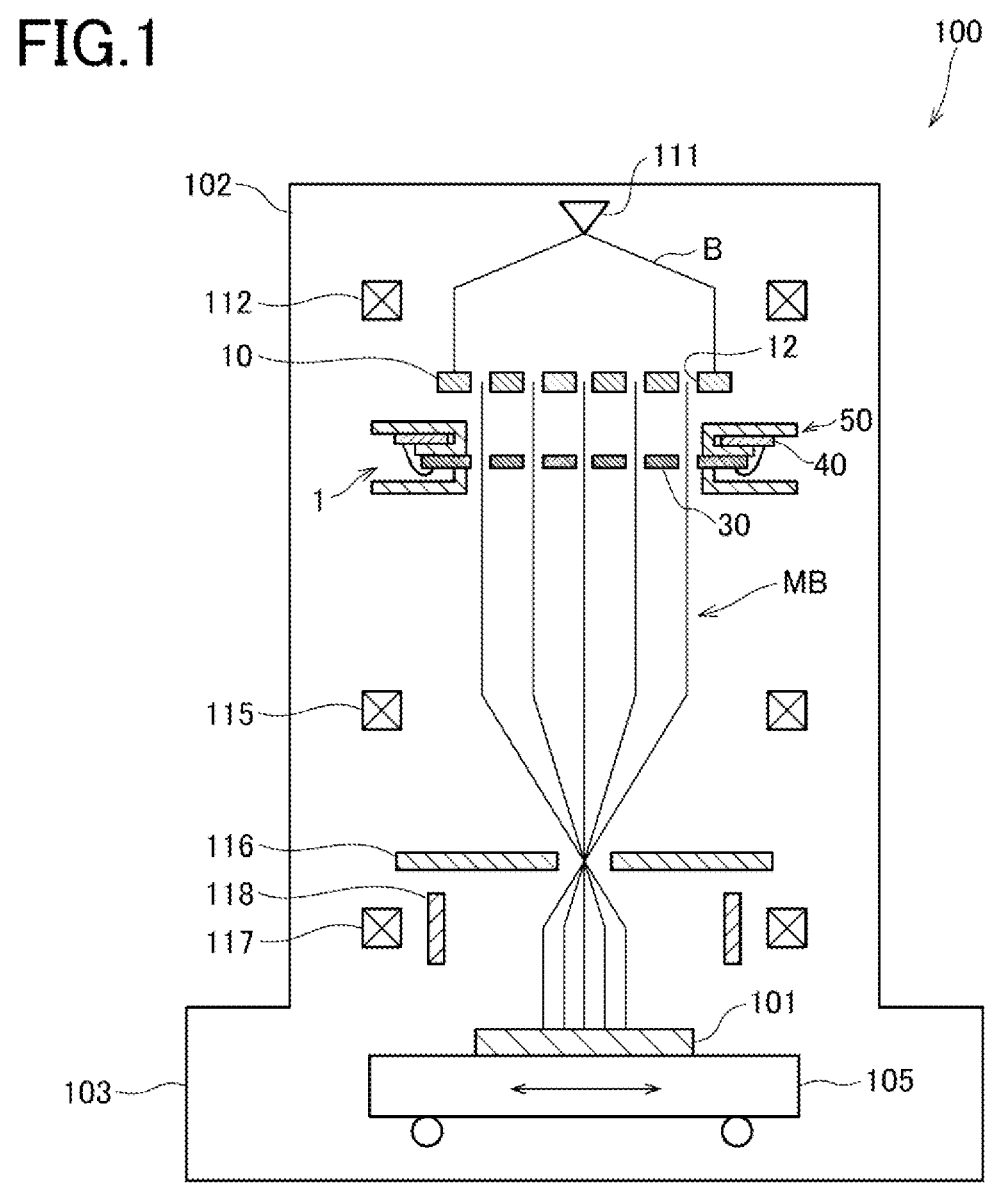

FIG. 1 is a schematic configuration view of a writing apparatus according to the embodiment. A writing apparatus 100 illustrated in FIG. 1 is an example of a multi charged particle beam writing apparatus. The writing apparatus 100 includes an electron optical column 102, and a writing chamber 103. In the electron optical column 102, an electron source 111, an illumination lens 112, a shaping aperture array substrate 10, a blanking aperture array system 1, a reduction lens 115, a limiting aperture member 116, a projector lens 117 and a deflector 118 are disposed.

The blanking aperture array system 1 has a blanking aperture array substrate 30, a mounting substrate 40 and a radiation shield 50. The blanking aperture array substrate 30 is mounted near the rear surface (lower surface) of the mounting substrate 40. In this embodiment, the upstream side in the traveling direction of the electron beam (multi-beam MB) is referred to as the surface side or the upper surface side, and the downstream side in the traveling direction is referred to as the rear surface side or the lower surface side.

The mounting substrate 40 has an opening for passing an electron beam (multi-beam MB) therethrough at the central part. The radiation shield 50 will be described later.

In the writing chamber 103, an XY stage 105 is disposed. At the time of writing, a sample 101 serving as a writing target substrate, such as a mask blank coated with resist and nothing has been written thereon is placed on the XY stage 105. The sample 101 includes a mask for exposure at the time of manufacturing a semiconductor device, or a semiconductor substrate (silicon wafer) on which a semiconductor device is fabricated.

As illustrated in FIG. 2, in the shaping aperture array substrate 10, openings 12 are formed in m vertical rows×n horizontal rows (m, n>=2) with a predetermined arrangement pitch. The openings 12 are formed as rectangles having the same dimensional shape. The shape of the openings 12 may be circular. A multi-beam MB is formed by part of electron beam B passing through the plurality of openings 12.

Figure 3:
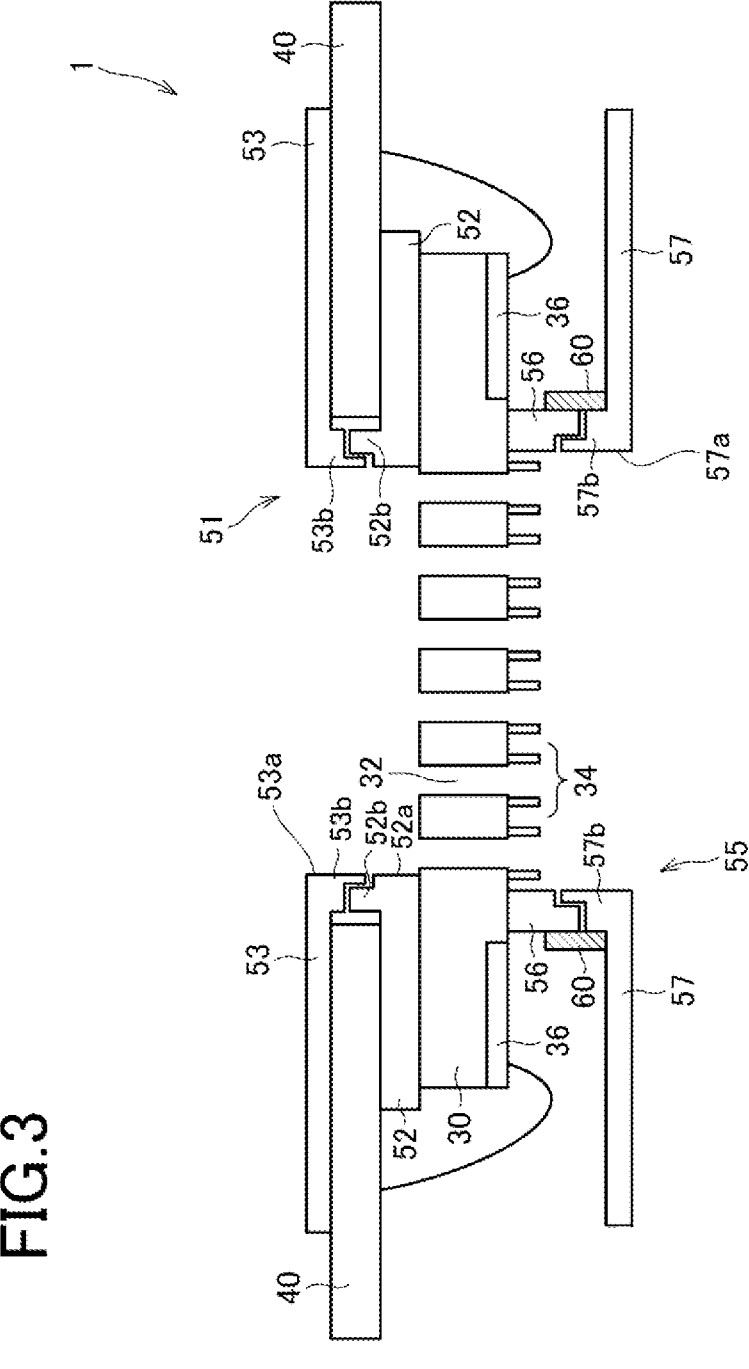
FIG. 3 is a schematic configuration view of a blanking aperture array system.

As illustrated in FIG. 3, in the blanking aperture array substrate 30, passage holes 32 are formed according to the arrangement positions of the openings 12 of the shaping aperture array substrate 10 to allow respective multi-beams MB to pass through the passage holes 32. In each passage hole 32, a blanker 34 consisting of a set of two electrodes as a pair is disposed. One of the electrodes of the blanker 34 is fixed to the ground potential, and the other is switched between the ground potential and another potential. An electron beam passing through each passage hole 32 is independently deflected by a voltage (electric field) applied to a corresponding blanker 34.

In this manner, a plurality of blankers 34 perform blanking deflection on corresponding beams of the multi-beam MB, which have passed through the plurality of openings 12 of the shaping aperture array substrate 10.

Figure 4:
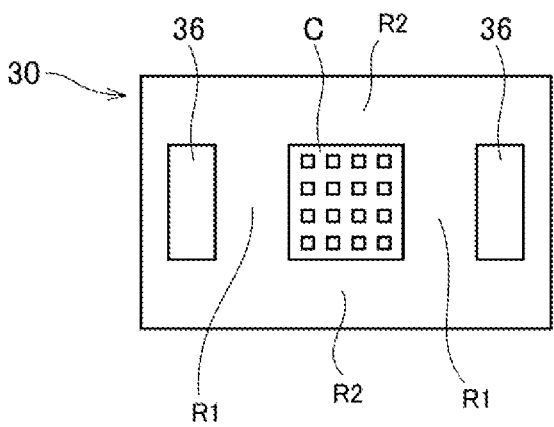
FIG. 4 is a plan view of a blanking aperture array substrate.

As illustrated in FIG. 4, the plurality of blankers 34 are provided in a cell section C in the center of the blanking aperture array substrate 30. The blanking aperture array substrate 30 is rectangular in a plan view, and is provided with respective circuit sections 36 on both sides of the cell section C in a longitudinal direction (first direction, the right and left direction in FIG. 4). Each circuit section 36 includes an LSI circuit that controls voltage application to the blankers 34.

The circuit section 36 disposed in the lower surface of the blanking aperture array substrate 30 has MOSFETs and is connected to the mounting substrate 40 by wire bonding to generate a signal according to data transferred from the outside, and apply a voltage to each blanker 34 through a wire (not illustrated) disposed in the blanking aperture array substrate 30. The circuit section 36 is provided with an input/output pad (not illustrated) to which wires are connected.

The cell section C is aligned with the opening of the mounting substrate 40.

An electron beam B emitted from the electron source 111 (emitter) illuminates the shaping aperture array substrate 10 in its entirety substantially perpendicularly by the illumination lens 112. The electron beam B passes through the plurality of openings 12 of the shaping aperture array substrate 10, thereby forming a plurality of electron beams (multi-beam MB). The multi-beam MB passes through corresponding passage holes 32 in the cell section C of the blanking aperture array substrate 30.

The multi-beam MB which has passed through the blanking aperture array substrate 30 is reduced by the reduction lens 115, and travels to an opening in the center of the limiting aperture member 116. Here, an electron beam slightly deflected by the blanker 34 is displaced from the opening in the center of the limiting aperture member 116, and blocked by the limiting aperture member 116. In contrast, an electron beam not deflected by the blanker 34 passes through the opening in the center of the limiting aperture member 116. The control of an electric field by voltage application to the blanker 34, that is, blanking control of a beam is performed by an on/off operation, and an off/on state on the sample 101 of the beam is controlled.

In this manner, the limiting aperture member 116 blocks those beams that have achieved a beam-off state by being deflected by the plurality of blankers 34. The time from beam-on to beam-off gives the exposure time for one shot by beam emission to the resist on the sample 101.

The multi-beam which has passed through the limiting aperture member 116 is focused on the sample 101 by the projector lens 117, and the shape (the image of an object surface) of the openings 12 of the shaping aperture array substrate 10 is projected onto the sample 101 (image surface) with a desired reduction ratio. The entire multi-beam is collectively deflected by the deflector 118 in the same direction, and is emitted to respective emission positions of the beams on the sample 101. When the XY stage 105 is continuously moved, the beam emission position is controlled by the deflector 118 so as to follow the movement of the XY stage 105.

When the multi-beam MB is formed by the shaping aperture array substrate 10, part of the electron beam B collides with the shaping aperture array substrate 10 to generate X-rays. In addition, when part of the electron beam B is scattered by the edges of the openings 12 or reflected by the side walls of the openings 12, and scattered electrons and reflected electrons collide with the blanking aperture array substrate 30 and/or other members in the writing apparatus, X-rays are generated from the electron collision location. When such X-rays are emitted to the circuit section 36 of the blanking aperture array substrate 30, the electrical characteristics of transistors deteriorates due to the TID effect, which may cause a malfunction.

Thus, in this embodiment, the circuit section 36 of the blanking aperture array substrate 30 is covered by the radiation shield 50 composed of a material having a high X-ray absorption rate to reduce the effect of X-rays. The radiation shield 50 has a higher X-ray absorption rate for a larger atomic number of the material. For this reason, it is preferable that the radiation shield 50 be composed of heavy metal such as tungsten, gold, tantalum, and lead. The radiation shield 50 preferably has a thickness that causes the X-rays generated in the writing apparatus to attenuate to approximately ¹/₁₀₀₀ to ¹/₁₀₀₀₀ or less.

As illustrated in FIG. 3, the radiation shield 50 has a first radiation shield 51 disposed in the upper surface of the blanking aperture array substrate 30, and a second radiation shield 55 disposed in the lower surface of the blanking aperture array substrate 30.

The first radiation shield 51 has a first plate 52 disposed between the mounting substrate 40 and the blanking aperture array substrate 30, and a second plate 53 disposed on the mounting substrate 40.

Figure 5:
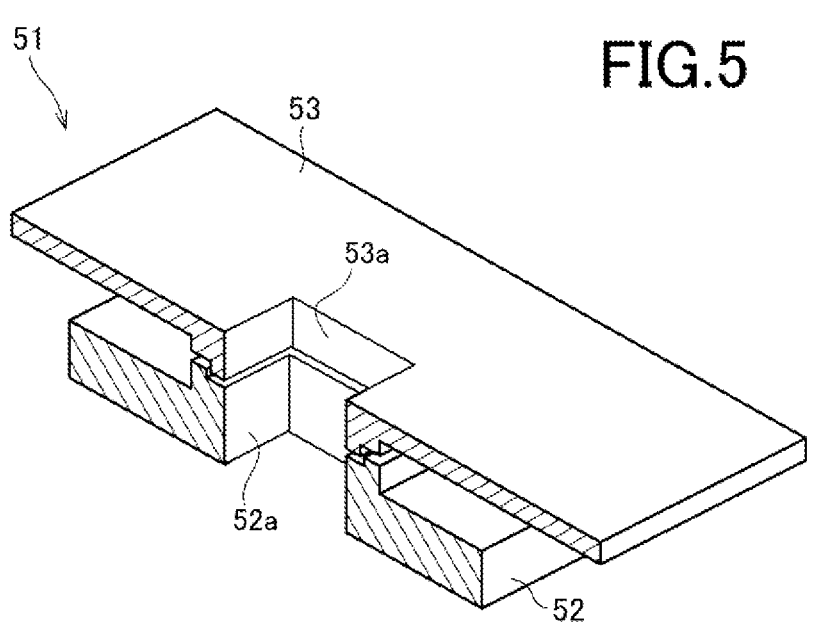
FIG. 5 is a cross-sectional perspective view of a first radiation shield.

As illustrated in FIG. 3, FIG. 5, a rectangular opening 52*a* (first opening) for passage of the multi-beam is formed in the first plate 52. A rectangular opening 53*a* (second opening) for passage of the multi-beam is formed in the second plate 53. The first plate 52 and the second plate 53 are disposed so that the multi-beam passes through the cell section C via the openings 52*a*, 53*a*. FIG. 5 is a cross-sectional perspective view of the first radiation shield 51. The first plate 52 extends from the peripheral edge of the opening 52*a* parallel to the upper surface of the blanking aperture array substrate 30. The second plate 53 extends from the peripheral edge of the opening 53*a* parallel to the upper surface of the blanking aperture array substrate 30.

The lower surface of the first plate 52 is in close contact with the upper surface of the blanking aperture array substrate 30. For example, the lower surface of the first plate 52 and the upper surface of the blanking aperture array substrate 30 are bonded by conductive adhesives such as silver paste.

The first plate 52 has a peripheral wall section 52*b* (first peripheral wall section) that stands upright from the peripheral edge of the opening 52*a*. The upper surface of the first plate 52 at a position nearer to the peripheral edge than the peripheral wall section 52*b* is in close contact with the lower surface of the mounting substrate 40. The upper surface of the first plate 52 and the lower surface of the mounting substrate 40 are bonded by conductive adhesives such as silver paste. The outer end of the first plate 52 in the wiring direction (the right and left direction in FIG. 5) of wire bonding is located outwardly of the outer end of the blanking aperture array substrate 30 as well as located inwardly of the connection point between the wire bonding and the mounting substrate 40.

The second plate 53 has a peripheral wall section 53*b* (second peripheral wall section) that hangs down from the peripheral edge of the opening 53*a*. The lower surface of the first plate 52 at a position nearer to the peripheral edge than the peripheral wall section 53*b* is in contact with the upper surface of the mounting substrate 40. The second plate 53 is fixed to the mounting substrate 40 or other members in the writing apparatus using a fastening member such as a screw.

The upper portion of the peripheral wall section 52*b* of the first plate 52 and the lower portion of the peripheral wall section 53*b* of the second plate 53 are provided with a notch, and the peripheral wall section 52*b* and the peripheral wall section 53*b* are connected by aligning and fitting a depression and a projection together. In a connected state of the peripheral wall section 52*b* and the peripheral wall section 53*b*, it is preferable that the inner peripheral surfaces be flush with each other and the outer peripheral surfaces be flush with each other.

Figure 12:
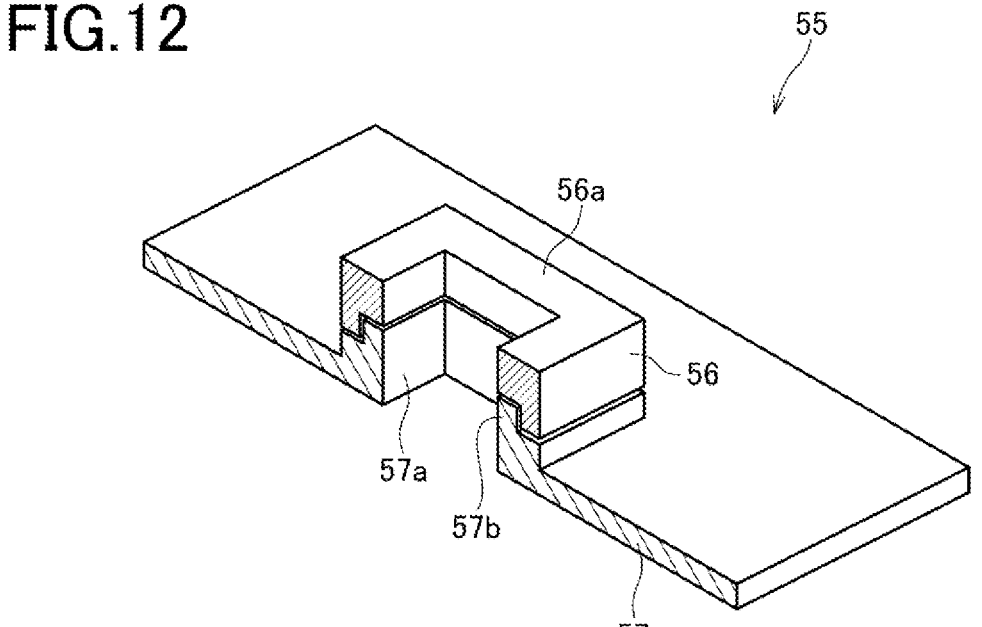
FIG. 12 is a cross-sectional perspective view of a second radiation shield.

As illustrated in FIG. 3, FIG. 12, the second radiation shield 55 has a peripheral wall section 56 (third peripheral wall section) that hangs down from the lower surface of the blanking aperture array substrate 30, and surrounds the cell section C, and a third plate 57 (lower plate). FIG. 12 is a cross-sectional perspective view of the second radiation shield 55.

The peripheral wall section 56 is provided in a region that is inwardly of the circuit section 36, and outwardly of the cell section C. The upper end of the peripheral wall section 56 is in close contact with the lower surface of the blanking aperture array substrate 30. For example, an upper end surface 56*a* of the peripheral wall section 56 and the lower surface of the blanking aperture array substrate 30 are bonded by conductive adhesives such as silver paste.

A rectangular opening 57*a* (lower opening) for passage of the multi-beam is formed in the third plate 57. The third plate 57 is disposed away from the lower surface of the blanking aperture array substrate 30, and extends from the peripheral edge of the opening 57*a* parallel to the lower surface of the blanking aperture array substrate 30. The third plate 57 has a peripheral wall section 57*b* (fourth peripheral wall section) that stands upright from the peripheral edge of the opening 57*a*.

The upper portion of the peripheral wall section 57*b* of the third plate 57 and the lower portion of the peripheral wall section 56 are provided with a notch, and the peripheral wall section 57*b* and the peripheral wall section 56 are connected by aligning and fitting a depression and a projection together. In a connected state of the peripheral wall section 57*b* and the peripheral wall section 56, it is preferable that the inner peripheral surfaces be flush with each other and the outer peripheral surfaces be flush with each other. A lower peripheral wall section located below the blanking aperture array substrate 30 is formed by the peripheral wall section 56 and the peripheral wall section 57*b*.

As illustrated in FIG. 4, when the blanking aperture array substrate 30 is provided with respective circuit sections 36 on both sides of the cell section C in a longitudinal direction (first direction, the right and left direction in FIG. 4), a lower peripheral wall section is provided in each of region R1 between the cell section C and the circuit section 36 and region R2 between the cell section C and the end of the blanking aperture array substrate 30 in a transverse direction (second direction, the upper and lower direction in FIG. 4). The circuit section 36 provided in the lower surface of the blanking aperture array substrate 30 is located in the space formed by the lower peripheral wall section and the third plate 57.

A cap member 60 is disposed on the outer peripheral surfaces of the peripheral wall section 57*b* and the peripheral wall section 56 so as to seal the gap between the upper portion of the peripheral wall section 57*b* and the lower portion of the peripheral wall section 56. The cap member 60 is composed of copper, titanium, tungsten or the like. The cap member 60 is fixed to other members in the writing apparatus using a fastening member such as a screw. The third plate 57 is fixed to the cap member 60 using a fastening member such as a screw.

The position of the outer end of the third plate 57 in the wiring direction (the right and left direction in FIG. 3) of wire bonding is approximately equal to the position of the outer end of the second plate 53, and is outwardly of the connection point between the wire bonding and the mounting substrate 40. In addition, the third plate 57 and the second plate 53 are approximately equal in thickness.

In this manner, the radiation shield 50 (the first plate 52, the second plate 53, the third plate 57) covers over and under the circuit section 36 of the blanking aperture array substrate 30, and the radiation shield 50 (the peripheral wall sections 52b, 53b, 56, 57b) is disposed between the region where the circuit section 36 is formed and a multi-beam passage region, thus the circuit section 36 can be protected from X-rays to prevent a malfunction of a circuit element, and the life of the blanking aperture array substrate 30 can be expanded.

In the above embodiment, the first radiation shield 51 is constituted by the first plate 52 and the second plate 53, and the second radiation shield 55 is constituted by the peripheral wall section 56 and the third plate 57, thus when the blanking aperture array substrate 30 is replaced, the first plate 52 and the peripheral wall section 56 bonded to the blanking aperture array substrate 30 are replaced together, but the second plate 53 and the third plate 57 can be continuously used independently, thus the cost can be reduced.

Figure 6A:
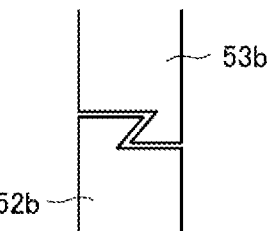
FIG. 6A, FIG. 6B, FIG. 6C are views illustrating examples of a fitting structure.
Figure 6B:
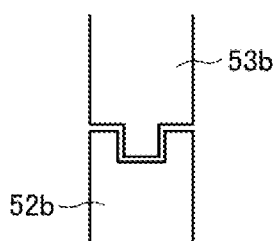
Figure 6C:
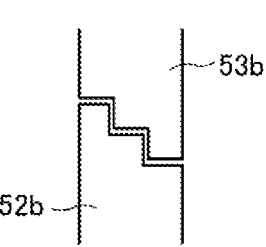

Because the connection section between the peripheral wall section 52b and the peripheral wall section 53b has a fitting structure obtained by combining notches, the gap between the peripheral wall section 52b and the peripheral wall section 53b has a step shape (zigzag), thus X-rays can be prevented from entering the circuit section 36. The shape of the fitting structure is not limited to the one illustrated in FIG. 3, and as illustrated in FIG. 6A, FIG. 6B, FIG. 6C, the number and inclination of step sections may vary. The same applies to the shape of the fitting structure obtained by the peripheral wall section 57b and the peripheral wall section 56.

Figure 7:
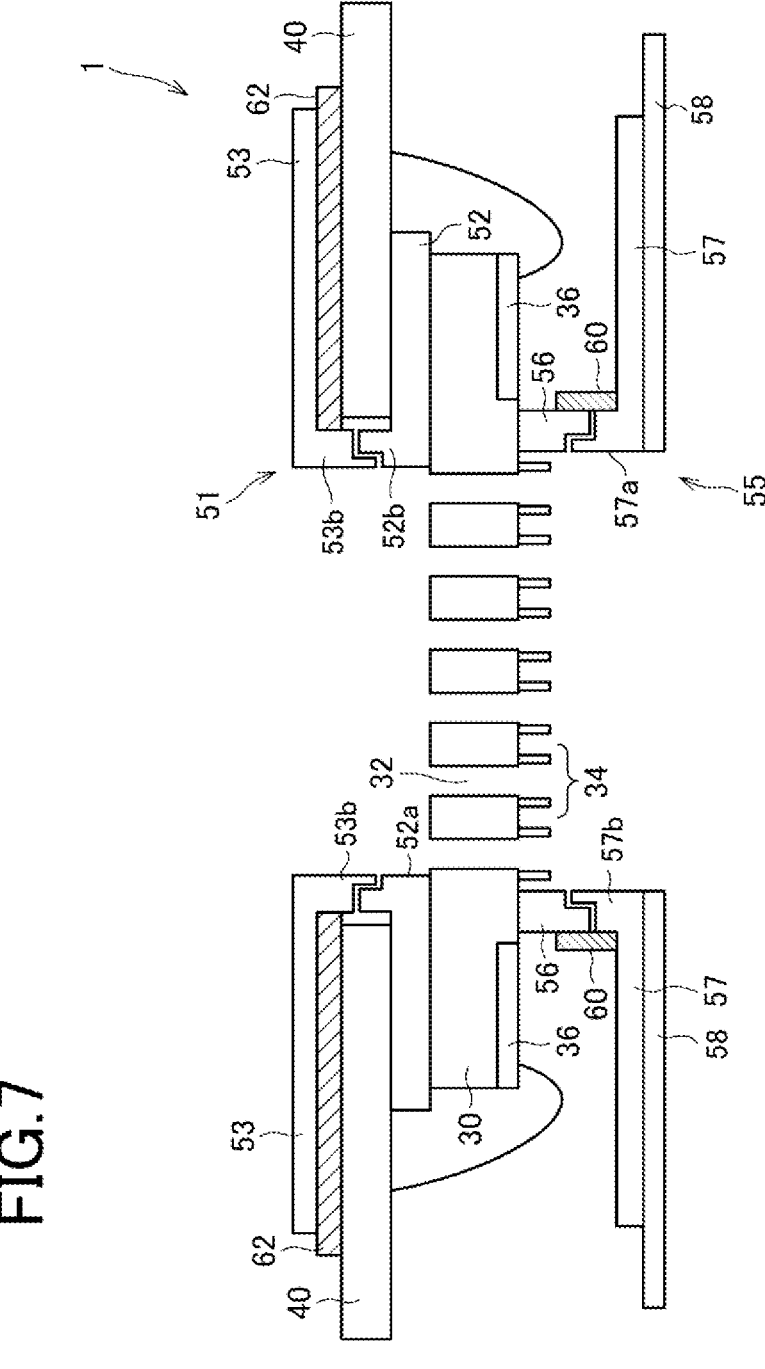
FIG. 7 is a schematic configuration view of a blanking aperture array system according to a modification.

As illustrated in FIG. 7, a fourth plate 62 made of metal may be disposed between the mounting substrate 40 and the second plate 53. The second plate 53 is fixed to the fourth plate 62 using a fastening member such as a screw. The fourth plate 62 may be fixed to the cap member 60 with a screw at a position away from the cell section C. In this situation, the mounting substrate 40 may be fixed to the fourth plate 62 by co-tightening. In terms of cost, non-magnetic metal less expensive than tungsten, such as lead and titanium is preferably used as the material for the fourth plate 62.

In addition, a fifth plate 58 composed of the same material as that of the third plate 57 may be mounted on the lower surface of the third plate 57 to increase the thickness of the second radiation shield 55. An opening for passage of the multi-beam in the same size as the opening of the third plate 57 is formed in the fifth plate 58, and the fifth plate 58 is mounted on the third plate 57 with the positions of the openings aligned. The method of mounting the fifth plate 58 to the third plate 57 is not limited, and may be screw fixing or bonding using conductive adhesives.

From the view point of manufacturing and assembling, it is more preferable to adopt a layered configuration of the third plate 57 and the fifth plate 58 than to increase the thickness of the third plate 57.

The position of the outer end of the fifth plate 58 in the wiring direction (the right and left direction in FIG. 7) of wire bonding is located outwardly of the position of the outer end of the third plate 57.

Figure 8:
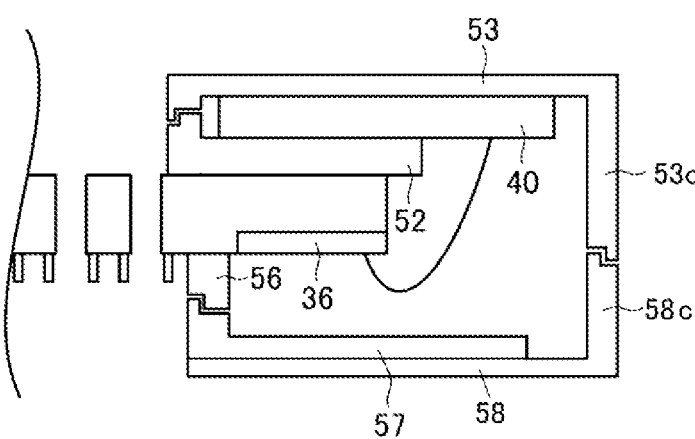
FIG. 8 is a partially enlarged view of a blanking aperture array system.

As illustrated in FIG. 8, a hanging-down piece 53c that hangs down from the lower surface of the second plate 53 of the first radiation shield 51 may be provided outwardly of the blanking aperture array substrate 30 as well as a stand-ing-upright piece 58c that stands upright from the upper surface of the fifth plate 58 of the second radiation shield 55 may be provided to seal between the second plate 53 and the fifth plate 58 by the standing-upright piece 53c and the standing-upright piece 58c so that scattered electrons may be prevented from entering. The lower end of the hanging-down piece 53c and the upper end of the standing-upright piece 58c are each provided with a notch, and a fitting structure may be obtained by combining the notches. Alternatively, the lower end of the hanging-down piece 53c and the upper end of the standing-upright piece 58c may be in contact with each other and screwed.

Figure 9:
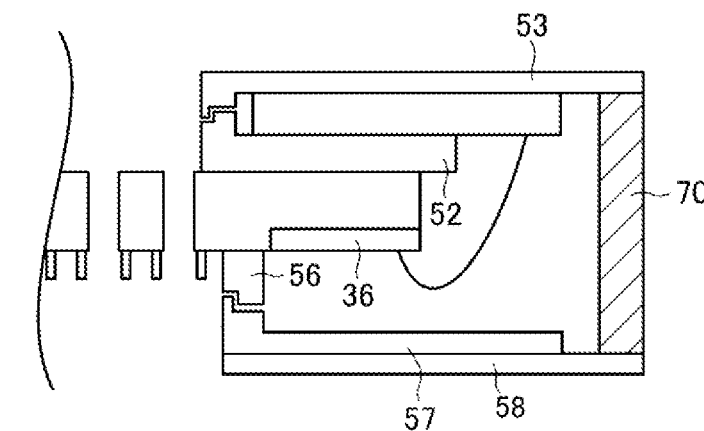
FIG. 9 is a partially enlarged view of a blanking aperture array system.

As illustrated in FIG. 9, a non-magnetic metal material 70 may be disposed outside the blanking aperture array substrate 30, between the lower surface of the second plate 53 of the first radiation shield 51 and the upper surface of the fifth plate 58 of the second radiation shield 55 to prevent scattered electrons from entering. In terms of cost, non-magnetic metal less expensive than tungsten, such as lead and titanium is preferably used for the non-magnetic metal material 70.

Figure 10:
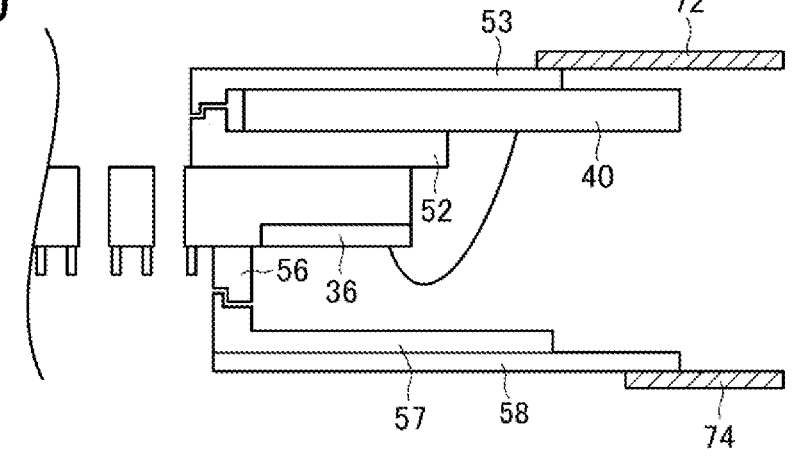
FIG. 10 is a partially enlarged view of a blanking aperture array system.

As illustrated in FIG. 10, a non-magnetic metal plate 72 may be provided on the upper surface of the second plate 53 of the first radiation shield 51 so as to extend outwardly of the second plate 53. Similarly, a non-magnetic metal plate 74 may be provided on the lower surface of the fifth plate 58 of the second radiation shield 55 so as to extend outwardly of the fifth plate 58. Scattered electrons can be prevented from entering by providing the non-magnetic metal plates 72, 74. In terms of cost, non-magnetic metal less expensive than tungsten, such as lead and titanium is preferably used for the non-magnetic metal plates 72, 74.

The second radiation shield 55 in a flat plate shape may be disposed in close contact with the lower surface of the blanking aperture array substrate 30. In this case, a wire for data transfer is connected to the lateral surface of the blanking aperture array substrate 30.

Figure 11:
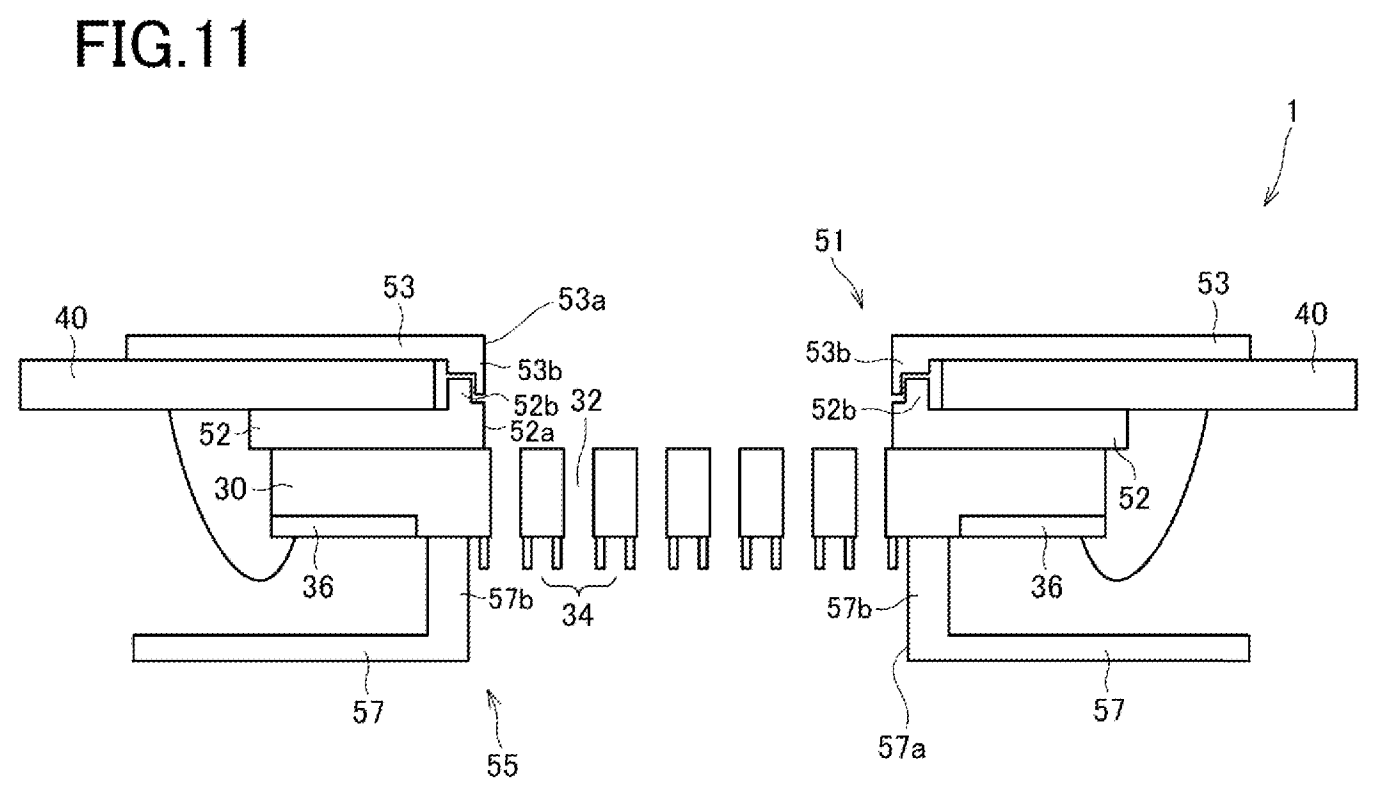

In the above embodiment, a configuration has been described in which the peripheral wall section 56 and the third plate 57 are separate bodies, and the cap member 60 is disposed on the outer peripheral surfaces of the peripheral wall section 57b and the peripheral wall section 56, but the peripheral wall section 56 and the third plate 57 may be integrated as illustrated in FIG. 11. In other words, a configuration may be adopted in which the upper end surface of the peripheral wall section 57b that stands upright from the third plate 57 is in close contact with the lower surface of the blanking aperture array substrate 30. In such a configuration, the cap member 60 may be omitted. The above-mentioned configuration is also applicable to the configuration illustrated in FIG. 7.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A blanking aperture array system comprising:

a blanking aperture array substrate including a plurality of beam passage holes, through which beams in a multi charged particle beam pass from upstream to down-stream, the plurality of beam passage holes being provided with respective blankers that perform blanking deflection on the beams;

a first radiation shield disposed upstream of the blanking aperture array substrate; and a second radiation shield disposed downstream of the blanking aperture array substrate, wherein a cell section including the beam passage holes and the blankers is provided in a central part of the blanking aperture array substrate, and a circuit section including a circuit element that applies a voltage to each of the blankers is disposed closer to a peripheral edge of the blanking aperture array substrate than the cell section, the first radiation shield includes a first plate covering over the circuit section, disposed on an upper surface of the blanking aperture array substrate, provided with a first opening for passage of the multi charged particle beam, and extending from a peripheral edge of the first opening, and the second radiation shield covers under the circuit section, and is provided with a lower opening for passage of the multi charged particle beam, the second radiation shield including a lower peripheral wall section that hangs down from a lower surface of the blanking aperture array substrate and surrounds the cell section, and a lower plate extending from a peripheral edge of the lower opening.

2. The blanking aperture array system according to claim 1, wherein the lower peripheral wall section surrounding the cell section is disposed in each of a region between the cell section and the circuit section of the blanking aperture array substrate, and a region between the cell section and an end of the blanking aperture array substrate, and the circuit section provided in a lower surface of the blanking aperture array substrate is located in a space formed by the lower peripheral wall section and the lower plate.

3. The blanking aperture array system according to claim 1, wherein the first radiation shield further includes a second plate that is disposed above the first plate, provided with a second opening for passage of the multi charged particle beam, and extends from a peripheral edge of the second opening, a first peripheral wall section stands upright from a peripheral edge of the first opening of the first plate, a second peripheral wall section hangs down from a peripheral edge of the second opening of the second plate, and an upper portion of the first peripheral wall section and a lower portion of the second peripheral wall section are connected in a fitting manner.

4. The blanking aperture array system according to claim 1, wherein the lower plate is continuous to a lower portion of the lower peripheral wall section, and disposed away from the lower surface of the blanking aperture array substrate.

5. The blanking aperture array system according to claim 4, wherein the lower peripheral wall section includes:

a third peripheral wall section that hangs down from the lower surface of the blanking aperture array substrate, and surrounds the cell section; and a fourth peripheral wall section that stands upright from a peripheral edge of the lower opening of the lower plate, and a lower portion of the third peripheral wall section and an upper portion of the fourth peripheral wall section are connected in a fitting manner.

6. The blanking aperture array system according to claim 5, further comprising a cap member that is disposed in outer peripheral surfaces of the third peripheral wall section and the fourth peripheral wall section, and seals a gap between the lower portion of the third peripheral wall section and the upper portion of the fourth peripheral wall section.

7. The blanking aperture array system according to claim 1, wherein a lower surface of the first plate and the upper surface of the blanking aperture array substrate are in close contact with each other.

8. The blanking aperture array system according to claim 5, wherein a lower surface of the first plate and the upper surface of the blanking aperture array substrate are bonded with adhesives, and an upper surface of the third peripheral wall section and the lower surface of the blanking aperture array substrate are bonded with adhesives.

9. The blanking aperture array system according to claim 3, further comprising a mounting substrate disposed between the first plate and the second plate, wherein the circuit section is provided in the lower surface of the blanking aperture array substrate, and connected to the mounting substrate by wire bonding.

10. The blanking aperture array system according to claim 3, wherein a hanging-down piece that hangs down from a lower surface of the second plate outside the blanking aperture array substrate, and a standing-upright piece that stands upright from an upper surface of the lower plate seal between the second plate and the lower plate.

11. The blanking aperture array system according to claim 10, wherein a lower portion of the hanging-down piece and an upper portion of the standing-upright piece are connected in a fitting manner.

12. The blanking aperture array system according to claim 3, wherein a non-magnetic metal material is disposed between a lower surface of the second plate and an upper surface of the lower plate, and outside the blanking aperture array substrate.

13. The blanking aperture array system according to claim 1, wherein the first radiation shield and the second radiation shield are composed of heavy metal.

14. A multi charged particle beam writing apparatus comprising:

a charged particle beam source that emits a charged particle beam;

a shaping aperture array substrate including a plurality of openings, and forming a multi charged particle beam by part of the charged particle beam passing through the plurality of openings from upstream to downstream;

a blanking aperture array substrate including a plurality of beam passage holes, through which beams in the multi charged particle beam pass from upstream to downstream, the plurality of beam passage holes being provided with respective blankers that perform blanking deflection on the beams;

a first radiation shield disposed upstream of the blanking aperture array substrate; and a second radiation shield disposed downstream of the blanking aperture array substrate, wherein a cell section including the beam passage holes and the blankers is provided in a central part of the blanking aperture array substrate, and a circuit section including a circuit element that applies a voltage to each of the blankers is disposed closer to a peripheral edge of the blanking aperture array substrate than the cell section, the first radiation shield includes a first plate covering over the circuit section, disposed on an upper surface of the blanking aperture array substrate, provided with a first opening for passage of the multi charged particle beam, and extending from a peripheral edge of the first opening, and the second radiation shield covers under the circuit section, and is provided with a lower opening for passage of the multi charged particle beam, the second radiation shield including a lower peripheral wall section that hangs down from a lower surface of the blanking aperture array substrate and surrounds the cell section, and a lower plate extending from a peripheral edge of the lower opening.

* * * * *